United States Patent [19]

Sato

[11] Patent Number: 5,238,871
[45] Date of Patent: Aug. 24, 1993

[54] METHOD OF MANUFACTURING A SEMICONDUCTOR DEVICE

[75] Inventor: Masato Sato, Suwa, Japan
[73] Assignee: Seiko Epson Corporation, Tokyo, Japan
[21] Appl. No.: 796,825
[22] Filed: Nov. 25, 1991

[30] Foreign Application Priority Data

Nov. 26, 1990 [JP] Japan .................. 2-321750

[51] Int. Cl.⁵ .......................... H01L 21/306
[52] U.S. Cl. .................... 437/186; 437/913; 437/946; 134/3; 134/31; 156/646; 148/DIG. 17; 148/DIG. 53
[58] Field of Search .......... 437/946, 913, 186; 148/DIG. 17, DIG. 53; 134/3, 31; 156/646

[56] References Cited

U.S. PATENT DOCUMENTS

| | | | |
|---|---|---|---|
| 3,426,422 | 2/1969 | Deal | 148/DIG. 17 |
| 4,264,374 | 4/1981 | Beyer et al. | 134/3 |
| 4,923,828 | 5/1990 | Gluck et al. | 437/225 |

FOREIGN PATENT DOCUMENTS

| | | | |
|---|---|---|---|
| 45-40458 | 12/1970 | Japan | 148/DIG. 17 |
| 1-204427 | 8/1989 | Japan | 148/DIG. 17 |

OTHER PUBLICATIONS

Burggraaf, P., "Vapor-phase cleaning at reduced pressure", Semiconductor International, p. 36, (Dec. 1989).
Sato et al., Japanese Journal of Applied Physics Extended Abstracts 22th. Conf. Solid State Devices and Materials (1990), Tokyo, Japan, pp. 1103–1106.
Frystak et al., Extended Abstracts Spring Meeting 88-1 (1988) May 15-20, Princeton, N.Y., USA, pp. 161–162.

*Primary Examiner*—Olik Chaudhuri
*Assistant Examiner*—Ourmazd Ojan
*Attorney, Agent, or Firm*—Oliff & Berridge

[57] ABSTRACT

A method of manufacturing a semiconductor device including a MOS-type field effect transistor includes cleansing a surface of a substrate; forming, next to the cleansing step, a gate oxide film on the cleansed surface of the substrate; wherein the cleansing step includes dry-etching the surface of the substrate in an atmosphere in which hydrogen fluoride and a substance containing at least a chlorine atom coexist in gaseous state and removing an oxide film and metal impurities on the surface of the substrate. Preferably, the dry-etching is performed under heat and decompression.

17 Claims, 3 Drawing Sheets

METHOD OF MANUFACTURING A SEMICONDUCTOR DEVICE

BACKGROUND OF THE INVENTION

1. Field of the Invention

This invention relates to a method of manufacturing a semiconductor device including a very reliable MOS-type field effect transistor (hereinafter called "MOSFET") by removing metal impurities during cleansing of the surface of a substrate.

2. Description of the Related Art

In manufacturing a semiconductor device including a MOSFET, the conventional cleansing process to be performed before forming a gate oxide film is exemplified as follows:

(a) A natural oxide film on the substrate is removed by a hydrogen fluoride (hereinafter called "HF") cleaning solution.

(b) cleaning is accomplished by using an oxide agent such as containing $NH_4OH$-$H_2O_2$, $HCl$-$H_2O_2$. This cleaning is called as "RCA cleaning".

Subsequent to this cleansing process, a gate oxide film is formed by thermal oxidation.

In an alternative method, after RCA cleaning, a chemical oxide film formed thereby is removed by using an HF cleaning solution, whereupon a gate oxide film is formed. However, since there is a fear that much of the impurities might adhere to the substrate during rinsing and cleansing after the HF wet cleaning, it has been a common practice to form the gate oxide film with the chemical oxide film left on the substrate, If the foregoing cleansing process is used, metal impurities in the oxide film on the substrate surface can be removed by eliminating the oxide film by using an HF cleaning solution, although many impurity particles would adhere to the surface of the substrate only by this cleansing process. Further, metal impurities existing chiefly in the cleaning solution would remain in the chemical oxide film formed by the RCA cleaning, and these impurities would be scattered in the gate oxide film, thus contaminating the gate oxide film. These impurities existing in the gate oxide film would have an affect on the pressure-resisting characteristic of the gate film and the TDDB (Time Dependent Dielectric Breakdown) characteristic, which is to be used in evaluating the reliability of the gate film, thus deteriorating the reliability of the MOSFET.

SUMMARY OF THE INVENTION

It is therefore an object of this invention to provide a method of manufacturing a semiconductor device including a highly reliable MOSFET by removing metal impurities and particles while cleansing the surface of a substrate before forming a gate oxide film.

According to this invention, there is provide a method of manufacturing a semiconductor device including a MOS-type field effect transistor, comprising the steps of: cleansing a surface of a substrate; forming, next to said cleansing, a gate oxide film on the cleansed surface of the substrate; wherein said cleansing step includes dry-etching the surface of the substrate in an atmosphere in which hydrogen fluoride and a substance containing at least a chlorine atom coexist in gaseous state and removing an oxide film and metal impurities on the surface of the substrate.

In this method, since hydrogen fluoride and a substance at least containing a chlorine atom coexist in a gaseous state during dry etching, it is possible to remove the metal impurities on the surface of the substrate as chlorides. As a result, it is possible to achieve high-level cleansing which is almost free from metal contamination and stacking of particles. Therefore, it is possible to form a very reliable MOSFET element which prevents the pressure-resisting characteristic of the gate film and the TDDB characteristic, which is to be used in evaluating the reliability of the gate film, from being impaired due to the metal impurities and particles.

Since generally a metal chloride is very volatile, it is possible to remove the metal chloride with ease by raising the temperature in the chamber to perform the dry etching and then reducing the pressure.

DETAILED DESCRIPTION

First Embodiment

FIGS. 1 through 7 show a series of manufacturing steps according to the first embodiment of this invention.

In this embodiment, an n-channel MOSFET is manufactured by way of illustrative example.

Figure 1:
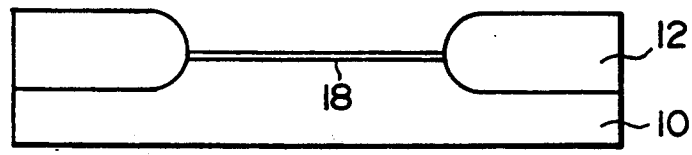
FIG. 1 is a schematic cross-sectional view showing the manner in which a field oxide film is formed on a silicon substrate in a first embodiment of this invention.

(a) In the step shown in FIG. 1, a field oxide film 12 is formed on a p-type silicon substrate 10 in the usual method. Before advancing to the next step, a natural oxide film 18, which is formed on the silicon substrate 10, is removed by wet etching with an HF cleaning solution.

Figure 2:
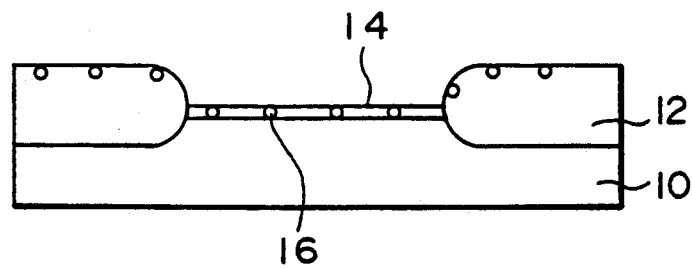
FIG. 2 is a schematic cross-sectional view showing the manner in which an RCA cleaning is performed to form a chemical oxide film in the first embodiment.

(b) In the step shown in FIG. 2, the surface of the silicon substrate 10 is cleansed by a so-called RCA cleaning, which is accomplished by an oxide agent containing $NH_4OH$-$H_2O_2$, $HCl$-$H_2O_2$.

At that time, in a chemical oxide film 14 formed by the RCA cleaning, metal impurities 16 such as aluminum, iron, copper, zinc, chrome or nickel exist chiefly due to the existence of metal in the ingredients of the RCA cleaning solution. Of these metals, aluminum and iron are most popular. So, it is important to remove these metals.

Figure 3:
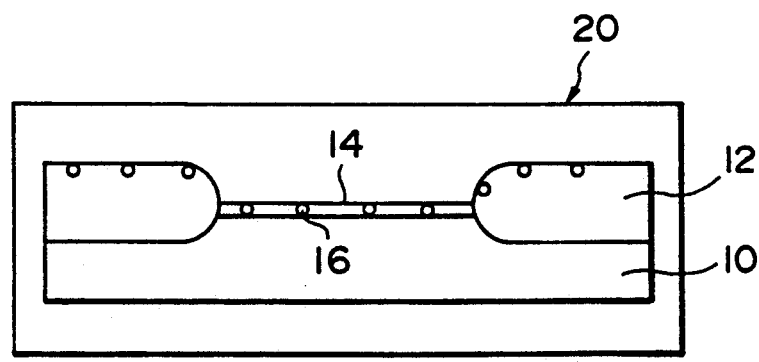
FIG. 3 is a schematic cross-sectional view showing the manner in which the substrate of FIG. 2 is cleansed by wet etching in the first embodiment.

(c) In the step shown in FIG. 3, in order to remove the contaminated substances such as the residuals of the RCA cleaning solution and the metal impurities in the chemical oxide film 14, wet cleaning is performed in a wet etching unit 20. An etching solution to be used in this step contains preferably nitric acid and HF, for example. After the wet cleaning, the usual rinsing and drying are performed. By this step, most of the chemical oxide film 14 and the contaminated substances are removed.

Figure 4:
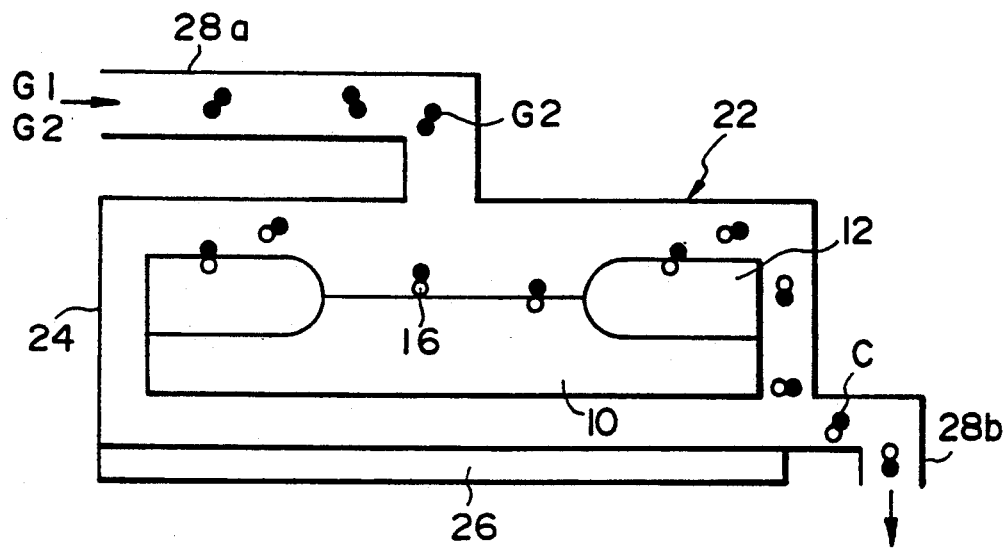
FIG. 4 is a schematic cross-sectional view showing the manner in which the substrate is further cleansed by dry etching in the first embodiment.

(d) In the step shown in FIG. 4, the wet-cleaned substrate is dry-cleaned by a dry etching unit 22. As a significant feature of this step, a chlorine gas G2 together with an HF etching gas G1 is supplied into a chamber 24 via an inlet 28a. The interior of the chamber 24 is heated by a heater 26 and is decompressed to a pressure lower than the normal atmospheric pressure.

This dry etching is performed under the following conditions:
Pressure in the chamber 24: 0.1 to 0.5 Torr.
Temperature in the chamber 24: 10° to 100° C.
Flow of HF gas: 50 to 100 SCC/minute
Flow of chlorine gas: 0.1 to 0.5 SCC/minute These conditions may be set otherwise within the appropriate scopes, depending on the presence/absence of wet cleaning, the state of the substrate, the thickness of an oxide film, the kind of the oxide film, etc.

In this step, the particles and metal impurities on the substrate are removed almost perfectly, obtaining a contamination-free clean substrate surface. In other words, the chlorine gas G2 reacts with the metal impurities 16 existing on the surface of the substrate 10 and the field oxide film 12, forming a metal chloride C. Since generally this metal chloride C is apt to be vaporized, the metal chloride C is released into the space in the chamber 24 under decompressure or under high heat and decompression and is then discharged to the outside from an outlet 28b. By dry etching with the HF gas G1, the chemical oxide film 14 is etched with the particles removed almost perfectly from the surface of the substrate 10.

Figure 5:
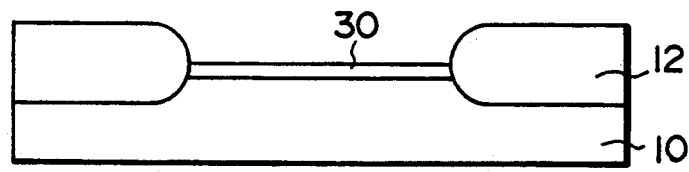
FIG. 5 is a schematic cross-sectional view showing the manner in which a gate oxide film is formed in the first embodiment.

(e) In the step shown in FIG. 5, in a clean room, thermal oxidation is performed to form a gate oxide film 30 having a thickness of tens to hundreds Angstrom.

Figure 6:
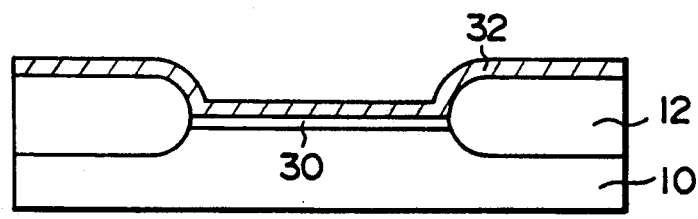
FIG. 6 is a schematic cross-sectional view showing the manner in which a polycrystalline silicon layer is formed in the first embodiment.

(f) In the step shown in FIG. 6, a p-type impurity, such as boron, constituting a channel is doped in the usual method, whereupon a polycrystalline silicon layer 32 is formed.

Figure 7:
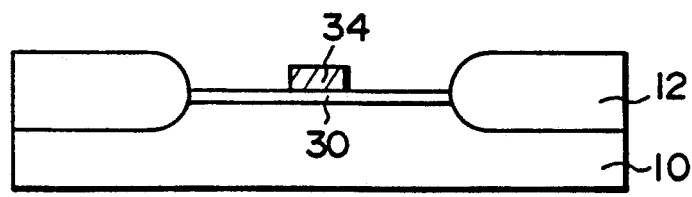
FIG. 7 is a schematic cross-sectional view showing the manner in which a gate electrode is formed in the first embodiment.

(g) In the step shown in FIG. 7, an n-type impurity such as phosphorous is doped in the usual method, whereupon a gate electrode 30 is formed by the usual photolithography and etching technology.

Further, although there is no illustration in the drawings, a source diffused region and a drain diffused region are formed by doping an n-type impurity such as arsenic in the usual method, and metallization is performed to form an electrode.

In this embodiment, the substance containing a chlorine atom provided by a chlorine gas for the most suitable example. However, it should by no means be limited to this specific example and may be an HCl gas, for example.

Second Embodiment

Figure 8:
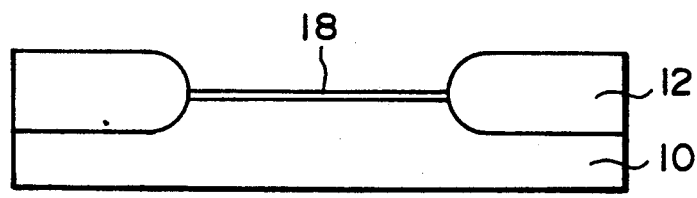
FIG. 8 is a schematic cross-sectional view showing the manner in which a field oxide film is formed in a second embodiment of the invention.
Figure 9:
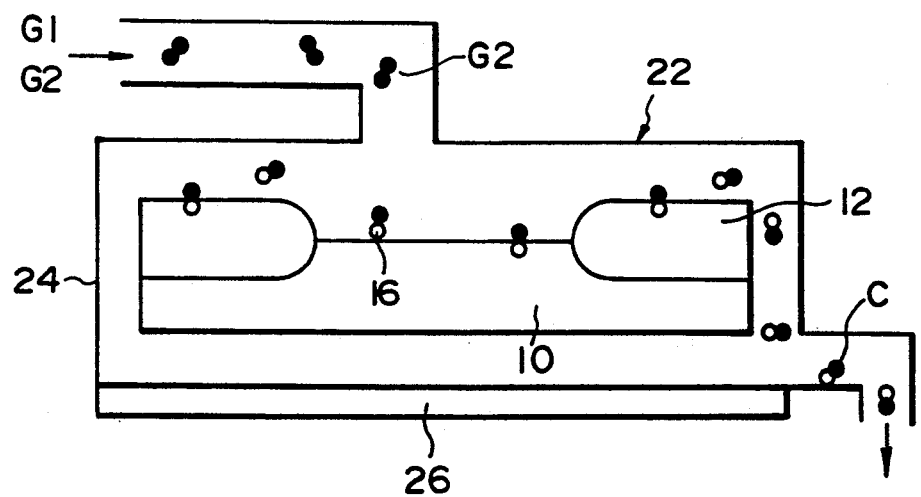
FIG. 9 is a schematic cross-sectional view showing the manner in which cleansing is accomplished by dry etching.

FIGS. 8 and 9 shows a series of manufacturing steps according to the second embodiment of this invention.

In this embodiment, the silicon substrate 10 with a field oxide film 12 formed thereon (corresponding to the step (a)) is dry-cleaned directly by etching by a dry etching unit 22, omitting the RCA-cleaning step (step (b)) and the wet etching step (step (c)). Since the dry etching step shown in FIG. 9 is basically identical with the dry etching step (the above-mentioned step (d)), its detailed description is omitted here for clarity.

In this embodiment, since the RCA-cleaning step and the wet etching step are omitted, dry cleaning in the dry etching step should be performed more adequately, compared to the first embodiment.

Although certain preferred embodiments have been shown and described, it should be understood that many changes and modifications may be made therein without departing from the scope of the appended claims. For example, the wet etching step (step (c)) may be omitted in the first embodiment. In the cleansing step of this invention, a conventional alternative mean may be added at a necessary stage. Further, this invention is also applicable to the production of an p-type MOSFET as well as a n-type MOSFET.

What is claimed is:

1. A method of manufacturing a semiconductor device including a MOS-type field effect transistor, comprising the steps of:
   cleansing a surface of a substrate;
   forming, after said cleansing step, a gate oxide film on the cleansed surface of the substrate; wherein said cleansing step includes:
   wet-etching the surface of said substrate to remove a natural oxide film therefrom;
   dry etching the surface of the substrate, after said wet-etching in an atmosphere in which hydrogen fluoride and a substance containing at least a chlorine atom coexist in a gaseous state under decompression, said dry-etching forming metal chlorides with metal impurities on the surface of said substrate; and
   removing an oxide film and said metal impurities from the surface of the substrate, said metal impurities being removed by removing said metal chlorides in a volatilized state.

2. A method according to claim 1, wherein said dry-etching is performed under heat and decompression.

3. A method according to claim 1, wherein said substance containing at least a chlorine atom is selected from the group consisting of chlorine and hydrochloric acid.

4. A method according to claim 1, wherein during said cleansing step, RCA cleaning is performed before said dry-etching.

5. A method according to claim 1, wherein said wet-etching is accomplished by using a cleaning solution containing nitric acid and hydrogen fluoride.

6. A method according to claim 1, wherein said dry-etching is performed at a pressure in the range from 0.1 to 0.5 Torr.

7. A method according to claim 2, wherein said dry-etching is performed at a temperature from 10° to 100° C.

8. A method according to claim 7, wherein said dry-etching is performed at a pressure in the range from 0.1 to 0.5 Torr.

9. A method according to claim 1, wherein said substance containing at least a chlorine atom flows through a chamber containing said substrate during said dry-etching at a rate of from 0.1 to 0.5 SCC/minute.

10. A method according to claim 1, wherein said hydrogen fluoride flows through a chamber containing said substrate during said dry-etching at a rate of from 50 to 100 SCC/minute.

11. A method according to claim 10, wherein said substance containing at least a chlorine atom flows through said chamber containing said substrate during said dry-etching at a rate of from 0.1 to 0.5 SCC/minute.

12. A method of manufacturing a semiconductor device including a MOS-type field effect transistor, comprising the steps of:

cleansing a surface of a substrate;

forming, after said cleansing step, a gate oxide film on the cleansed surface of the substrate; wherein said cleansing step includes:

wet-etching the surface of said substrate to remove a natural oxide film therefrom;

dry-etching the surface of the substrate, after said wet-etching in an atmosphere in which hydrogen fluoride and a substance containing at least a chlorine atom coexist in a gaseous state under decompression at a pressure in the range from 0.1 to 0.5 Torr.; and removing an oxide film and metal impurities from the surface of the substrate.

13. A method according to claim 12, wherein said substance containing at least a chlorine atom is selected from the group consisting of chlorine and hydrochloric acid.

14. A method according to claim 12, wherein said wet-etching is accomplished by using a cleaning solution containing nitric acid and hydrogen fluoride.

15. A method according to claim 12, wherein said dry-etching is performed at a temperature from 10° to 100° C.

16. A method according to claim 12, wherein said substance containing at least a chlorine atom flows through a chamber containing said substrate during said dry-etching at a rate of from 0.1 to 0.5 SCC/minute.

17. A method according to claim 12, wherein said hydrogen fluoride flows through a chamber containing said substrate during said dry-etching at a rate of from 50 to 100 SCC/minute.

* * * * *